United States Patent
Haapoja

(10) Patent No.: US 7,027,784 B2
(45) Date of Patent: Apr. 11, 2006

(54) METHOD AND APPARATUS FOR DETECTING POWER LEVELS OF VARYING ENVELOPE SIGNALS

(75) Inventor: Sami Haapoja, Helsinki (FI)

(73) Assignee: Nokia Corporation, Espoo (FI)

( * ) Notice: Subject to any disclaimer, the term of this patent is extended or adjusted under 35 U.S.C. 154(b) by 531 days.

(21) Appl. No.: 09/945,772

(22) Filed: Sep. 4, 2001

(65) Prior Publication Data

US 2003/0045250 A1   Mar. 6, 2003

(51) Int. Cl.
*H04B 1/04* (2006.01)
*H03C 1/52* (2006.01)

(52) U.S. Cl. .................. 455/126; 455/91; 455/108; 455/115; 455/115.4; 455/114.3; 455/127; 455/222; 455/226.4

(58) Field of Classification Search ............... 455/103, 455/115, 116, 126, 127, 69, 70, 115.4, 226.4, 455/222, 91, 108, 114.3; 340/136, 149; 375/303, 375/308

See application file for complete search history.

(56) References Cited

U.S. PATENT DOCUMENTS

| | | | |
|---|---|---|---|
| 5,659,892 A * | 8/1997 | Soleimani et al. ......... | 455/103 |
| 6,173,162 B1 * | 1/2001 | Dahlman et al. ............ | 455/69 |
| 6,384,681 B1 * | 5/2002 | Bonds ........................ | 330/149 |
| 6,856,793 B1 * | 2/2005 | Dunne et al. ............ | 455/115.4 |
| 2001/0012765 A1 * | 8/2001 | Noreus et al. | |
| 2002/0168026 A1 * | 11/2002 | Khoini-Poorfard | |

OTHER PUBLICATIONS

Stephan V. Schell, Implementation Effect on GSM's Edge Modulation, Tropian, Inc.
Simona Lohan, 12. Channel Estimation in Spread Spectrum Systems, Tampere University of Technology (Apr. 14, 2001).
Markku Pukkila, Channel Estimation Modeling Modeling, Nokia Research Center (Dec. 19, 2000).
Anders Furuskär et al., EDGE, Enhanced Data Rates For GSM and TDMA/136 Evolution, Ericsson Radio System.

* cited by examiner

*Primary Examiner*—Allan Hoosain
(74) *Attorney, Agent, or Firm*—Cohen, Pontani, Lieberman & Pavane

(57) ABSTRACT

A method for measuring a power level of a radio frequency signal in a radio frequency transmitter includes routing a portion of the radio frequency signal to a detector, detecting a signal envelope of the radio frequency signal with the detector, routing the detected signal to a digital signal processor, and talking at least one sample from the detected signal envelope using the digital signal processor and determining a detected power level of the radio frequency signal from the at least one sample, wherein the at least one sample lies in a portion of the detected signal envelope having a known non-random sequence.

17 Claims, 4 Drawing Sheets

METHOD AND APPARATUS FOR DETECTING POWER LEVELS OF VARYING ENVELOPE SIGNALS

BACKGROUND OF THE INVENTION

1. Field of the Invention

The present invention relates to a method and an apparatus for detecting the power level of a radio frequency signal being sent to an antenna of a mobile transmitter such as a mobile phone. The detected power level is used in an automatic gain control circuit.

2. Description of the Related Art

Power detection of radio frequency (RF) signals in a known Digital Advanced Mobile Phone System (DAMPS) may be implemented by taking a plurality of samples of the RF signals from a signal envelope and averaging the samples using Digital Signal Processing (DSP) to eliminate variations in the signal envelope. Since the variations in the envelopes of the modulated RF signals are not that large in DAMPS, the samples may be randomly taken to gain a useful estimate of the power level of the RF signals.

In other modulated RF signals such as Enhanced Data Rates for GSM Evolution (EDGE) modulated signals, the variations in the signal envelopes are much greater, which makes it more difficult to achieve a useful estimate of the power level of the RF signals using random samples. Averaging on the analog side may be employed to reduce the envelope variations, after which the above described sampling may be used. However, the EDGE modulated signal may be a multi-slot signal, in which case there is only a 30 microsecond gap between consecutive time slots, and the power difference between the slots may be as great as 20–30 dB. It is therefore difficult to configure and deploy a low-pass filter with a time constant that is small enough to ensure fast discharge and that also has a sufficiently low corner frequency to minimize error in the detected power.

SUMMARY OF THE INVENTION

It is accordingly an object of the present invention to provide a power detection method and apparatus for a radio transmitter having RF signals exhibiting large variations in the signal envelope that overcomes the problems of the prior art.

This object is met in implementations of the present invention by taking samples of the RF signal to be transmitted during a training sequence or other known non-random sequence of the signal envelope. Information is transmitted in GSM (Global System for Mobile communication) format in transmission packets or bursts having a predefined length and structure. The training sequence is a part of each burst and is disposed in the same location in each burst. There are eight different training sequences specified in the GSM/EDGE specifications. Each transmission channel has one of the eight training sequences allocated to that channel, so that each transmission packet sent on one of the transmission channels includes the particular training sequence that is allocated to that channel.

In GSM systems, each transmission packet is transmitted via a radio interface and is affected by randomly fluctuating interferences which impart delays, amplitude changes and phase changes to the original signal. The training sequence sent with the transmission packet is known by the receiver and is used by the receiver to determine an estimate of the radio channel (i.e., the multipath delays and the multipath amplitude and phase changes of the channel).

In order to measure the power level of a transmitted RF signal in a mobile terminal, a part of the RF signal is routed to an envelope detector such as a detector diode. The detected signal envelope is then routed via an A/D-converter to a Digital Signal Processor (DSP) which takes at least one sample from a portion of a known non-random sequence, i.e., the training sequence, to determine a power level. Two or more samples of the detected signal envelope may also be used to determine the power level more accurately.

As noted above, eight specific training sequences are defined in the GSM/EDGE specifications. As a radio transmitter in a mobile station moves from cell to cell, the transmission channel to which the mobile station is assigned will change. Accordingly, the mobile station may be required to use any one of the eight training sequences as a function of the particular transmission channel on which the radio transmitter is communicating. Therefore, an important consideration in determining the power level is the time at which to sample the training sequence so that the power level is accurately measured regardless of which of the eight training sequences is being used. A comparison of the eight training sequences defined by the GSM/EDGE specifications reveals that there is only one point at which each of the eight training sequences has the same value. However, the signal envelopes of the training sequences have high slopes at this common point and therefore require a high sampling instant certainty. Two other identifiable points exist in which the average of the voltage of the two points is the same for each training sequence with sufficient accuracy. These other identifiable points are accordingly employed in accordance with the present invention because they are at locations along the signal envelopes of the training sequences that do not have high slopes and therefore do not require as high a sampling instant uncertainty.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

DETAILED DESCRIPTION OF THE PRESENTLY PREFERRED EMBODIMENTS

Figure 1:
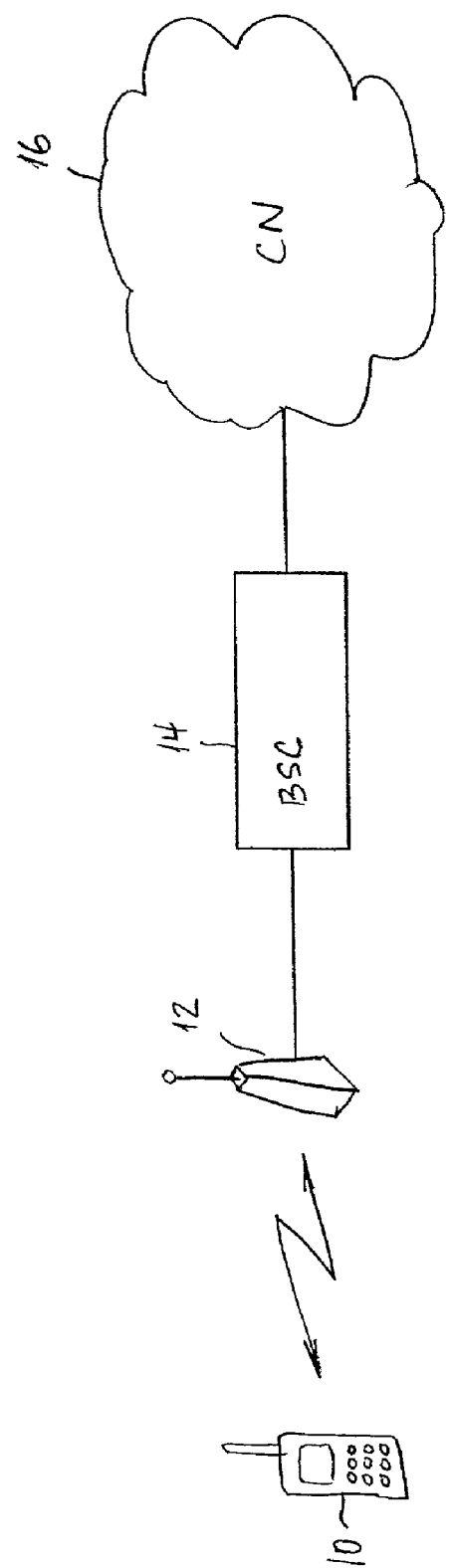
FIG. 1 is a schematic diagram of a communication network in which the present invention is implemented.

FIG. 1 depicts a Global System for Mobile communications/Enhanced Data rates for GSM Evolution (GSM/EDGE) network architecture. In a typical GSM/EDGE network, a Mobile Station (MS) 10 communicates with a Base Transceiver Station (BTS) 12 via a radio interface. A Base Station Controller (BSC) 14 is connected to multiple BTSs and manages the allocation and release of radio channels and handovers. The BSC 14 is in communication with a core network 16 which is generally interconnected with other networks. EDGE is a radio interface improvement and therefore affects radio transmission between the MS 10 and the BTS 12 of the BSC 14. The EDGE modulation algorithm codes the bit source and introduces an 8 phase-shift-keyed (PSK) modulation to the coded signal to be transmitted between the MS 10 and BSC 14. A more detailed description of the EDGE modulated signal is contained in an article by Stephan V. Schell, *Implementation Effects on GSM's EDGE Modulation*, Tropian, Inc., the contents of which are expressly incorporated by reference herein. The EDGE modulated signal facilitates the use of higher bit rates. However, inherent in the EDGE systems are high variations in the signal envelopes of the modulated signal, thereby rendering it difficult to determine the power level of the RF signal using random samples of the signal envelope. A reliable determination of power level is necessary for use in gain control of the signal being broadcast by the radio transmitter of MS 10 and BTS 12.

Figure 2:
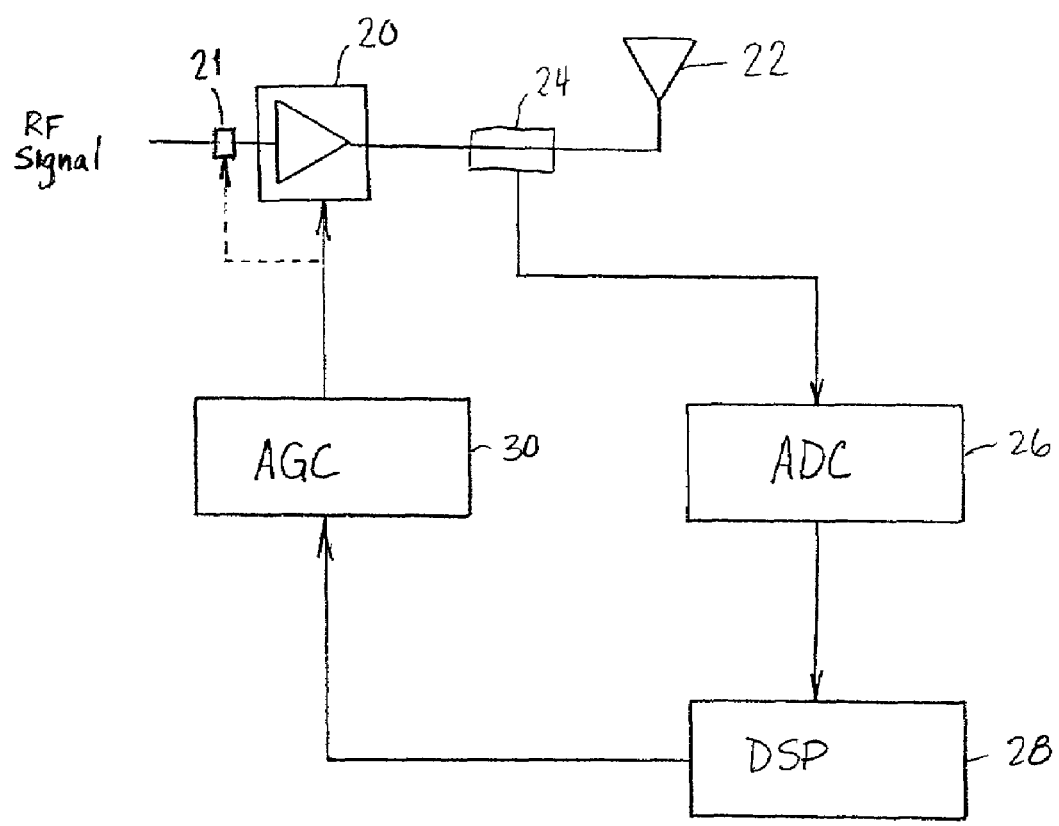
FIG. 2 is a block partial schematic of a radio transmitter which includes a power level detector according to an embodiment of the present invention.

Each of MS 10 and BTS 12 includes a radio transmitter as shown in relevant part in FIG. 2. The EDGE modulated RF signal is input to an amplifier 20 and the amplified signal is delivered to an antenna 22 for broadcast. A detector 24 detects the amplified signal and may comprise a directional coupler and a diode based rectifier or any other known detection equipment such, for example, as a circulator or capacitor/isolator. Alternatively, the needed envelope information may also be directly detected from the amplifier 20 IC. The detected signal is digitized in an analog-to-digital converter (ADC) 26 and the digitized signal is sent to a digital signal processor (DSP) 28 which samples non-random portions of the detected signal and determines detected power information. Since the non-random portion always occurs at the same location on the signal envelope, the DSP 28 may include a counter that determines the time at which the sample should be taken. An automatic gain control (AGC) 30 receives the detected power information and adjusts the gain of amplifier 20 to match a desired transmission power level of the radio transmitter. As an alternative, the AGC 30 may adjust an attenuator 21 of the radio transmitter to match a desired transmission power level.

Figure 3:
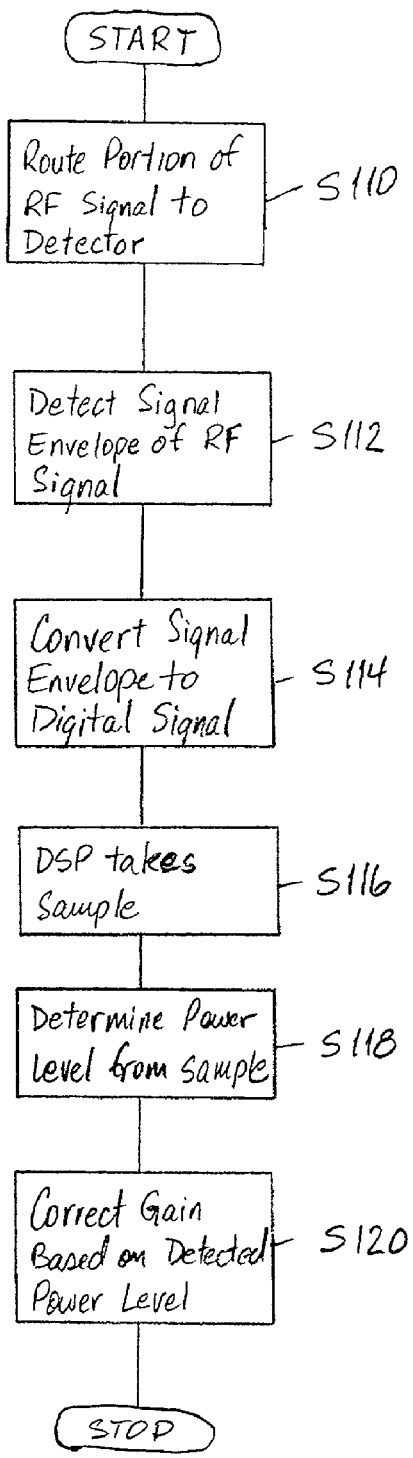
FIG. 3 is a flow chart of a method for measuring the power level of an RF signal according to the present invention.

FIG. 3 depicts a method for measuring the power level of a radio frequency (RF) signal in an RF transmitter. A portion of the RF signal to be transmitted is routed to a detector 24 at step S110. The detector 24 is then used to detect a signal envelope of the RF signal (step S112). Of course, the power level information may alternatively be received directly from the amplifier 20 at steps S110 and S112, in which case there is no need to route a portion of the RF signal to the detector 24. Regardless of how it is detected, the detected signal envelope is converted to a digital signal in the ADC 26 (step S114) and is then transmitted to the DSP 28. DSP 28 takes at least one sample from a non-random portion of the detected signal envelope at step S116. The non-random portion is a known sequence of the signal envelope defined by a signal protocol, such as a training sequence in a GSM/EDGE modulated signal. Finally, the power level is determined using the average of at least one sample (step S118), and that determined power level is then employed by the AGC to correct the transmission power gain of the RF transmitter at step S120.

As described above, the non-random portion of the detected signal envelope may in preferred forms of the invention comprise a predetermined training sequence of the GSM/EDGE modulated signal. The training sequence is a known sequence of bits that is sent with a transmission packet and allows the receiver to determine an estimate of the radio channel. Of course, any other non-random sequence may alternately be used. There are eight different predetermined training sequences defined in GSM/EDGE specifications, and one of those eight sequences is allocated to each channel and is included at a specific location in each transmission packet that is transmitted on that channel. A radio transmitter in a mobile station 10 must be able to use any of the eight different training sequences, and accordingly, the point at which to take the at least one sample during each non-random training sequence is an important consideration in step S116 of the inventive method. The invention therefore provides that the samples be taken so that the average power of the sample(s) is the same irrespective of the particular training sequence assigned to the channel in use. The power level may then be detected with high reliability regardless of which training sequence is currently being used.

Figure 4:
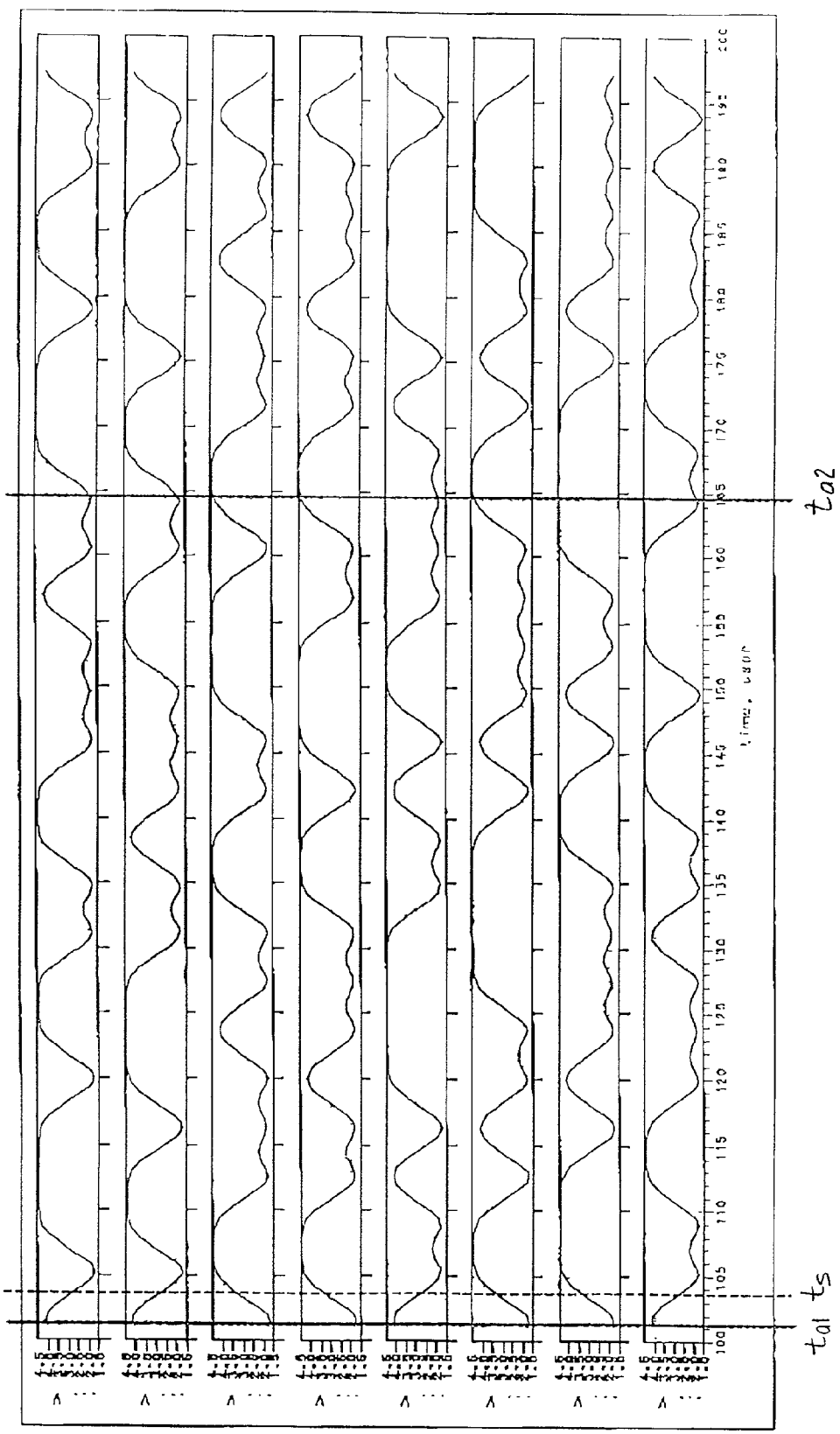
FIG. 4 is a timing chart showing non-random portions of an 8-PSK RF signal envelope in a Global System for Mobile communication system.

FIG. 4 depicts the eight different training sequences defined by the GSM/EDGE specifications. As described above, the samples taken by DSP 28 for use in detecting the power level of the transmission signal must yield an accurate detected power for all of the pre-defined nonrandom portions, i.e., the eight training sequences without regard to which is then in use. The limiting factors may be, e.g., the timing accuracy requirement of the TX/RX slots, which is defined by the accuracy requirement for the start and stop of a burst or transmission packet, and the timing accuracy capability of DSP 28. As shown in FIG. 4, there is one time instant $t_s$ at which all of the training sequences have the same voltage value; the voltages of the signal envelopes, however, have the highest slopes at this point which translates to the highest likelihood of error due to sampling inaccuracies. The typical expected timing accuracy is approximately ±1 microsecond due to the timing accuracy of the DSP 28 and the TX/RX slots. Accordingly, the likely error due to sampling inaccuracy at the high slope point $t_s$ is too great to achieve a useful estimate of RF signal power level of the RF signal at that time instant. Since there are no other points at which each of the training sequences have the same voltage value, in accordance with the invention the eight training sequences may be analyzed to identify any other time instants that produce the same average voltage and are associated with envelope slopes for which the timing inaccuracies produce likely errors within acceptable limits. The two time instants $t_{a1}$, $t_{a2}$ marked by the solid lines in FIG. 4 meet that criteria. For each of the eight training sequences, one of the time instants $t_{a1}$, $t_{a2}$ has a high value and the other has a low value and the average of the two time instants $(t_{a1}+t_{a2})/2$ is the same within sufficient accuracy and the range of error due to sampling inaccuracies is acceptable, e.g. ±0.25 dB. The actual acceptable error due to sampling inaccuracies depends on the power level accuracy partition. Of course, other signaling protocols using varying envelope modulation such as US TDMA (IS-136), CDMA (IS-95), CDMA2000, WLAN systems and WCDMA and forthcoming 3GPP releases which include increasingly complex modulations, have lower or higher acceptable accuracy requirements as well as different optimal sampling instants.

The foregoing example specifically demonstrates the use of two samples for determining the average power level in each of eight training sequences. However, three or more samples may also be used to increase the accuracy of the estimate. The generic procedure for determining when to sample involves the identification of at least one timing instant which has the same average value for each of the known non-random sequences during which the sample may be taken. If only one sample is used, the value of each of the eight training sequences at that timing instant must be the same. If more than one sample is used, the average value of the multiple samples for each of the sequences must be the same. The number of samples needed depends on modulation method used and the non-random bit sequence configuration. Furthermore, the number of samples must be high enough so that the power level error which results from sampling inaccuracies is within a tolerable range. In the specific illustrative case of the training sequences that are defined for GSM/EDGE systems, at least two points are required because the only timing instant $t_s$ where each of the training sequences has the same value is associated with a high slope that produces a prohibitive error level due to sampling inaccuracies. It is nevertheless conceivable that in a system other than GSM/EDGE, a set of non-random sequences may have a single common sample point that meets the required criteria of the present invention.

Thus, while there have shown and described and pointed out fundamental novel features of the invention as applied to preferred embodiments thereof, it will be understood that various omissions and substitutions and changes in the form and details of the methods described and devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for measuring a power level of a radio frequency signal to be transmitted by a radio frequency transmitter, said method comprising the steps of:
   (a) detecting a signal envelope of the radio frequency signal;
   (b) routing the detected signal to a digital signal processor; and
   (c) taking at least one sample from the detected signal envelope using the digital signal processor and determining a detected power level of the radio frequency signal from the at least one sample, wherein the at least one sample is in a portion of the detected signal envelope having a known sequence, and the at least one sample is determined at a location having a sufficiently low slope such that the error due to sampling inaccuracies of the digital signal processor is within an acceptable range.

2. The method of claim 1, further comprising the step of averaging the signal envelope of the radio frequency signal in analog form prior to said step (b).

3. The method of claim 1, wherein the known sequence is one of a plurality of known sequences.

4. The method of claim 3, wherein said step of taking at least one sample further comprises determining at least one timing instant to take the at least one sample, respectively, such that the average power level of the at least one sample point is the same for each of the plural known sequences.

5. The method of claim 1, wherein the radio frequency signal comprises a variable signal envelope.

6. The method of claim 1, wherein the radio frequency signal alternately comprises one of a variable signal envelope and a constant signal envelope.

7. The method of claim 1, further comprising the steps:
   (d) transmitting the detected power level information to an automatic gain circuit;
   (e) determining a difference between the detected power level and a desired power level; and
   (f) adjusting the gain of the transmitter in response to the difference between the detected power level and the desired power level.

8. The method of claim 1, wherein the portion of the detected signal in said step (b) is a predefined training sequence of a signal protocol.

9. The method of claim 8, wherein said step (c) comprises determining a detected power level of the radio frequency signal from a plurality of samples and averaging the samples such that the detected power level is an average power level of the plurality of samples.

10. The method of claim 9, wherein the signal protocol is GSM/EDGE and the plurality of samples comprises two samples.

11. The method of claim 9, wherein the digital signal processor has a sampling uncertainty and said step of taking samples comprises selecting the samples so that an error produced by the sampling uncertainty is minimized.

12. A radio transmitter device, comprising:
   an amplifier for amplifying a radio frequency signal;
   an antenna connected to said amplifier for broadcasting the radio frequency signal;
   a detecting arrangement for detecting a signal envelope of the radio frequency signal;
   a digital signal processor arranged for taking at least one sample from a non-random sequence in the detected signal envelope to determine the power level of the radio frequency signal, wherein the at least one sample is determined at a location having a sufficiently low slope such that the error due to sampling inaccuracies of the digital signal processor is within an acceptable range; and
   an automatic gain control connected to said digital signal processor and said amplifier for adjusting a gain of said amplifier in response to the determined power level of the radio frequency signal.

13. The radio transmitter device of claim 12, wherein the radio transmitter is arranged in a mobile station.

14. The radio transmitter device of claim 12, wherein the radio frequency signal has a variable envelope.

15. The radio transmitter device of claim 14, wherein said digital signal processor is arranged for taking two samples from the non-random sequence in the detected signal envelope to determine the power level of the radio frequency signal when used signal protocol is Enhanced Data rates for GSM Evolution.

16. The radio transmitter of claim 12, wherein the non-random sequence is a predefined training sequence of a signal protocol.

17. The radio transmitter of claim 12, wherein the non-random sequence in the detected signal envelope is one of a plurality of known sequences, and said at least one sample is taken by said digital signal processor at at least one timing instant, respectively, such that the average power level of the at least one sample is the same for each of the plurality of known sequences.

* * * * *